United States Patent
Mirkhani et al.

(10) Patent No.: US 10,677,815 B2
(45) Date of Patent: Jun. 9, 2020

(54) TEST SYSTEM HAVING DISTRIBUTED RESOURCES

(71) Applicant: Teradyne, Inc., North Reading, MA (US)

(72) Inventors: Mohamadreza Ray Mirkhani, Porter Ranch, CA (US); Kevin P. Manning, Thousand Oaks, CA (US); Roya Yaghmai, Westlake Village, CA (US); Timothy Lee Farris, Moorpark, CA (US); Frank Parrish, Simi Valley, CA (US)

(73) Assignee: Teradyne, Inc., North Reading ( * ) Notice: Subject to any disclaimer, the term of this patent is extended or adjusted under 35 U.S.C. 154(b) by 83 days.

(21) Appl. No.: 16/003,466

(22) Filed: Jun. 8, 2018

(65) Prior Publication Data
US 2019/0377007 A1 Dec. 12, 2019

(51) Int. Cl.
*G01R 1/073* (2006.01)
*G01R 31/28* (2006.01)

(52) U.S. Cl.
CPC ..... *G01R 1/07378* (2013.01); *G01R 31/2834* (2013.01)

(58) Field of Classification Search
CPC .... G01R 1/073; G01R 1/07378; G01R 31/28; G01R 31/2834; G01R 31/2889; G01R 31/2844; G01R 31/31713; G01R 31/318572; G01R 31/31905; G01R 31/31912
See application file for complete search history.

(56) References Cited

U.S. PATENT DOCUMENTS

| | | |
|---|---|---|
| 3,516,077 A | 6/1970 | Bobeck et al. |
| 3,577,131 A | 5/1971 | Morrow et al. |
| 3,673,433 A | 6/1972 | Kupfer |
| 3,934,236 A | 1/1976 | Aiken et al. |
| 4,021,790 A | 5/1977 | Aiken et al. |
| 4,117,543 A | 9/1978 | Minnick et al. |
| 4,692,839 A | 9/1987 | Lee et al. |
| 4,729,166 A | 3/1988 | Lee et al. |
| 4,754,546 A | 7/1988 | Lee et al. |
| 4,758,785 A | 7/1988 | Rath |

(Continued)

FOREIGN PATENT DOCUMENTS

| | | |
|---|---|---|
| EP | 0298219 A2 | 1/1989 |
| EP | 0361779 A1 | 4/1990 |
| VC | 4757256 A | 7/1988 |
| WO | 1988/005544 A1 | 7/1988 |
| WO | 2013/134568 A1 | 9/2013 |
| WO | 2017/091259 A1 | 6/2017 |

OTHER PUBLICATIONS

International Search Report for PCT/US2019/028246, 3 pages (dated Aug. 9, 2019).

(Continued)

*Primary Examiner* — Son T Le
(74) *Attorney, Agent, or Firm* — Burns Levinson LLP.

(57) ABSTRACT

An example test system has resources that are distributed for access by a device under test (DUT). The example test system includes a device interface board (DIB) having sites to connect to devices to test, and a tester having slots configured to hold test instruments. Each test instrument has resources that are distributed over a dimension of the DIB. The resources are distributed to enable the devices in the sites equal access to the resources.

22 Claims, 8 Drawing Sheets

(56) References Cited

U.S. PATENT DOCUMENTS

| | | |
|---|---|---|
| 4,778,950 A | 10/1988 | Lee et al. |
| 4,804,132 A | 2/1989 | Difrancesco |
| 4,912,399 A | 3/1990 | Greub et al. |
| 4,918,383 A | 4/1990 | Huff et al. |
| 4,922,192 A | 5/1990 | Gross et al. |
| 4,954,873 A | 9/1990 | Lee et al. |
| 4,975,638 A | 12/1990 | Evans et al. |
| 4,980,637 A | 12/1990 | Huff et al. |
| 5,020,219 A | 6/1991 | Leedy |
| 5,072,176 A | 12/1991 | Miller et al. |
| 5,083,697 A | 1/1992 | Difrancesco |
| 5,103,557 A | 4/1992 | Leedy |
| 5,132,613 A | 7/1992 | Papae et al. |
| 5,180,977 A | 1/1993 | Huff |
| 5,264,787 A | 11/1993 | Woith et al. |
| 5,355,079 A | 10/1994 | Evans et al. |
| 5,378,982 A | 1/1995 | Feigenbaum et al. |
| 5,416,429 A | 5/1995 | McQuade et al. |
| 5,422,574 A | 6/1995 | Kister |
| 5,456,404 A | 10/1995 | Robinette, Jr. et al. |
| 5,468,157 A | 11/1995 | Roebuck et al. |
| 5,469,072 A | 11/1995 | Williams et al. |
| 5,623,213 A | 4/1997 | Liu et al. |
| 5,914,613 A | 6/1999 | Gleason et al. |
| 5,968,282 A | 10/1999 | Yamasaka |
| 5,973,405 A | 10/1999 | Keukelaar et al. |
| 6,040,691 A * | 3/2000 | Hanners ............ G01R 31/2891 324/756.07 |
| 6,246,245 B1 | 6/2001 | Akram et al. |
| 6,256,882 B1 | 7/2001 | Gleason et al. |
| 6,307,387 B1 | 10/2001 | Gleason et al. |
| 6,356,098 B1 | 3/2002 | Akram et al. |
| 6,359,337 B1 | 3/2002 | Keukelaar et al. |
| 6,437,584 B1 | 8/2002 | Gleason et al. |
| 6,494,734 B1 | 12/2002 | Shuey |
| 6,499,216 B1 | 12/2002 | Fjelstad |
| 6,566,898 B2 | 5/2003 | Theissen et al. |
| 6,578,264 B1 | 6/2003 | Gleason et al. |
| 6,586,955 B2 | 7/2003 | Fjelstad et al. |
| 6,633,175 B1 | 10/2003 | Evans et al. |
| 6,661,244 B2 | 12/2003 | McQuade et al. |
| 6,690,186 B2 | 2/2004 | Fjelstad |
| 6,708,386 B2 | 3/2004 | Gleason et al. |
| 6,756,797 B2 | 6/2004 | Brandorff et al. |
| 6,825,677 B2 | 11/2004 | Gleason et al. |
| 6,838,890 B2 | 1/2005 | Tervo et al. |
| 6,860,009 B2 | 3/2005 | Gleason et al. |
| 6,911,835 B2 | 6/2005 | Chraft et al. |
| 6,927,585 B2 | 8/2005 | Gleason et al. |
| 6,927,586 B2 | 8/2005 | Thiessen |
| 6,930,498 B2 | 8/2005 | Tervo et al. |
| 6,965,244 B2 | 11/2005 | Miller |
| 7,084,657 B2 | 8/2006 | Matsumura |
| 7,109,731 B2 | 9/2006 | Gleason et al. |
| 7,148,711 B2 | 12/2006 | Tervo et al. |
| 7,161,363 B2 | 1/2007 | Gleason et al. |
| 7,178,236 B2 | 2/2007 | Gleason et al. |
| 7,227,371 B2 | 6/2007 | Miller |
| 7,233,160 B2 | 6/2007 | Hayden et al. |
| 7,266,889 B2 | 9/2007 | Gleason et al. |
| 7,271,603 B2 | 9/2007 | Gleason et al. |
| 7,285,969 B2 | 10/2007 | Hayden et al. |
| 7,304,488 B2 | 12/2007 | Gleason et al. |
| 7,355,420 B2 | 4/2008 | Smith et al. |
| 7,368,927 B2 | 5/2008 | Smith et al. |
| 7,400,155 B2 | 7/2008 | Gleason et al. |
| 7,403,025 B2 | 7/2008 | Tervo et al. |
| 7,403,028 B2 | 7/2008 | Campbell |
| 7,417,446 B2 | 8/2008 | Hayden et al. |
| 7,420,381 B2 | 9/2008 | Burcham et al. |
| 7,427,868 B2 | 9/2008 | Strid et al. |
| 7,436,194 B2 | 10/2008 | Gleason et al. |
| 7,443,181 B2 | 10/2008 | Miller |
| 7,443,186 B2 | 10/2008 | Strid et al. |
| 7,449,899 B2 | 11/2008 | Campbell et al. |
| 7,453,275 B2 | 11/2008 | Yamaguchi |
| 7,453,276 B2 | 11/2008 | Hayden et al. |
| 7,456,646 B2 | 11/2008 | Hayden et al. |
| 7,482,823 B2 | 1/2009 | Gleason et al. |
| 7,489,149 B2 | 2/2009 | Gleason et al. |
| 7,492,175 B2 | 2/2009 | Smith et al. |
| 7,495,461 B2 | 2/2009 | Hayden et al. |
| 7,498,829 B2 | 3/2009 | Gleason et al. |
| 7,501,842 B2 | 3/2009 | Gleason et al. |
| 7,504,842 B2 | 3/2009 | Schwindt |
| 7,514,944 B2 | 4/2009 | Smith et al. |
| 7,518,387 B2 | 4/2009 | Gleason et al. |
| 7,533,462 B2 | 5/2009 | Gleason et al. |
| 7,535,247 B2 | 5/2009 | Andrews et al. |
| 7,541,821 B2 | 6/2009 | Gleason et al. |
| 7,601,039 B2 | 10/2009 | Eldridge et al. |
| 7,609,077 B2 | 10/2009 | Campbell et al. |
| 7,619,419 B2 | 11/2009 | Campbell |
| 7,656,172 B2 | 2/2010 | Andrews et al. |
| 7,681,312 B2 | 3/2010 | Gleason et al. |
| 7,688,097 B2 | 3/2010 | Hayden et al. |
| 7,723,999 B2 | 5/2010 | Strid et al. |
| 7,750,652 B2 | 7/2010 | Campbell |
| 7,759,953 B2 | 7/2010 | Strid et al. |
| 7,761,983 B2 | 7/2010 | Hayden et al. |
| 7,761,986 B2 | 7/2010 | Gleason et al. |
| 7,764,072 B2 | 7/2010 | Strid et al. |
| 7,764,075 B2 | 7/2010 | Miller |
| 7,791,361 B2 | 9/2010 | Karklin et al. |
| 7,800,001 B2 | 9/2010 | Hamada et al. |
| 7,876,114 B2 | 1/2011 | Campbell et al. |
| 7,888,957 B2 | 2/2011 | Smith et al. |
| 7,893,704 B2 | 2/2011 | Gleason et al. |
| 7,898,273 B2 | 3/2011 | Gleason et al. |
| 7,898,281 B2 | 3/2011 | Andrews et al. |
| 7,934,944 B2 | 5/2011 | Hamada et al. |
| 7,934,945 B2 | 5/2011 | Narita et al. |
| 7,940,069 B2 | 5/2011 | Andrews et al. |
| 8,013,623 B2 | 9/2011 | Burcham et al. |
| 8,033,838 B2 | 10/2011 | Eldridge et al. |
| 8,202,684 B2 | 6/2012 | Hamada et al. |
| 8,373,428 B2 | 2/2013 | Eldridge et al. |
| 8,410,806 B2 | 4/2013 | Smith |
| 8,451,017 B2 | 5/2013 | Gleason et al. |
| 9,435,855 B2 | 9/2016 | Lewinnek et al. |
| 9,594,114 B2 | 3/2017 | Sinsheimer |
| 2003/0122538 A1 | 7/2003 | Parrish et al. |
| 2005/0174137 A1 | 8/2005 | Devey |
| 2005/0223543 A1 | 10/2005 | Cohen et al. |
| 2006/0082358 A1 | 4/2006 | Conner |
| 2006/0124927 A1 | 6/2006 | Groves et al. |
| 2008/0061808 A1 | 3/2008 | Mok et al. |
| 2008/0100323 A1 | 5/2008 | Mayder |
| 2008/0265919 A1 | 10/2008 | Izadian |
| 2011/0080187 A1* | 4/2011 | Hotz .................. G01R 31/2889 324/756.02 |
| 2011/0095778 A1 | 4/2011 | Chou et al. |
| 2012/0017428 A1 | 1/2012 | Hsu et al. |
| 2012/0034820 A1 | 2/2012 | Lang et al. |
| 2012/0175612 A1 | 7/2012 | Ding et al. |
| 2014/0361798 A1 | 12/2014 | Johnson |
| 2015/0137848 A1* | 5/2015 | Lewinnek .......... G01R 31/2889 324/756.03 |
| 2015/0377946 A1 | 12/2015 | Sinsheimer |
| 2016/0018442 A1 | 1/2016 | Sinsheimer et al. |

OTHER PUBLICATIONS

Written Opinion for PCT/US2019/028246, 8 pages (dated Aug. 9, 2019).

International Search Report and Written Opinion; PCT/US2014/063646; dated Jan. 28, 2015; 15 pp.

"Reliant Switch High Repeatability". DowKey.com, Data Sheet: retrieved on Feb. 3, 2015, http://www.dowkey.com/_news_attach_files/0/_plk121_1_Reliant_Switch_Datasheet.pdf.

"New Product Release: Reliant Switch for better RF testing." DowKey.com, copyright 2010, retrieved on Feb. 3, 2015, http://www.dowkey.com/news_details.php?id= 110.

(56) References Cited

OTHER PUBLICATIONS

Ralston et al., "Liquid-Metal Vertical Interconnects for Flip Chip Assembly of GaAs C-Band Power Amplifiers Onto Micro-Rectangular Coaxial Transmission Lines", IEEE Journal of Solid-State Circuits, vol. 47, No. 10 (Oct. 2012).
Reid et al., "Micromachined Rectangular-Coaxial Transmission Lines", IEEE Transactions on Microwave Theory and Techniques, vol. 54, No. 8 (Aug. 2006).
West, et al., Principles of CMOS VLSI Design. A Systems Perspective, 2nd Ed., Chapter 8 (1993).
Doane, D., "Foreword: Advancing MCM Technologies", IEEE Transactions on Components, Packaging, and Manufacturing Technology Part B. Advanced Packaging, 17(1):1 (Feb. 1994).
Russell, T., "Testing", IEEE Transactions on Components, Packaging, Manufacturing Technology-Part B. Advanced Packaging, 17(1):2 (Feb. 1994).
Davidson, E., "Design, Analysis, Applications", IEEE Transactions on Components, Packaging, Manufacturing Technology-Part B. Advanced Packaging, 17(1):2 (Feb. 1994).
Marshall et al., "CAD-Based Net Capacitance Testing of Unpopulated MCM Substrates", IEEE Transactions on Components, Packaging, Manufacturing Technology-Part B. Advanced Packaging, 17(1):50-55 (Feb. 1994).
Economikos et al., "Electrical Test of Multichip Substrates", IEEE Transactions on Components, Packaging, Manufacturing Technology Part B. Advanced Packaging, 17(1):56-61 (Feb. 1994).
Brunner et al., "Electron-Beam MCM Testing and Probing", IEEE Transactions on Components, Packaging, Manufacturing Technology-Part B. Advanced Packaging (1994).
Chong et al., "The Evolution of MCM Test from High Performance Bipolar Mainframe Multichip Modules to Low Cost Work Station Mulitchip Modules", ICEMM Proceedings '93, pp. 404-410.
Probe Technology, "Prober Interface Unit for HP83000 Model INT768" (at least before Apr. 22, 1997, the issue date of U.S. Pat. No. 5,623,213).
PCT International Search Report and Written Opinion for PCT/US2015/036213 dated Sep. 25, 2015 (9 pp).
Kister et al., "Test Cost Reduction Using the Membrane Probe". Probe Technology, Santa Clara, CA (at least before Apr. 22, 1997, the issue date of U.S. Pat. No. 5,623,213).
Fisher et al., "Reducing Test Costs for High-Speed and High Pin-Count Devices". Probe Technology, Feb. 1992, Santa Clara, CA.
Fresh Quest Corporation, "Fresh Quest Corporation Announces the Deliver of QC2TM Bare Die Carriers and QPCTM Probe Cards for the Production of Known Good Die". Chandler, AZ (at least before Apr. 22, 1997, the issue date of U.S. Pat. No. 5,623,213).
Fresh Quest Corporation, "Quest Pricing Guidelines" (at least before Apr. 22, 1997, the issue date of U.S. Pat. No. 5,623,213).
Hewlett Packard. "High Speed Wafer Probing with the HP 83000 Model F660", 1993, Germany.
Hughes Aircraft Company, "Additional Technical Data for Hughes" Membrane Test Probe, 1993.
Probe Technology, "Membrane Probe Card—The Concept" (at least before Apr. 22, 1997, the issue date of U.S. Pat. No. 5,623,213).
Packard Hughes Interconnect, "Our New IC Membrane Test Probe. It's priced the Same, but It Costs Less.", 1993, Irvine, CA.
Packard Hughes Interconnect, "Science Over Art, Our New IC Membrane Test Probe", 1993, Irvine, CA.
Hughes, "Membrane Wafer Probe—The Future of the IC Test Industry" (at least before Apr. 22, 1997, the issue date of U.S. Pat. No. 5,623,213).

* cited by examiner

TEST SYSTEM HAVING DISTRIBUTED RESOURCES

TECHNICAL FIELD

This specification relates generally a test system having resources that are distributed for access by devices under test (DUT).

BACKGROUND

A device interface board (DIB) is the device-specific interface to a generic test system. For example, a DIB may be configured to accommodate different types of devices, such as microprocessors or memory chips. DIBs may also be manufacturer-specific, meaning that a manufacturer of a device may provide the DIB prior to testing. Test signals are routed from the test system through the DIB to the devices under test (DUTs). Signals from the DUT are routed through the DIB to the test system for analysis in order to determine whether the DUT has passed the testing.

SUMMARY

An example test system has resources that are distributed for access by a device under test (DUT). The example test system includes a device interface board (DIB) comprising sites to connect to devices to test, and a tester comprising slots configured to hold test instruments. Each test instrument has resources that are distributed over a dimension of the DIB. The resources are distributed to enable the devices in the sites equal access to the resources. The example test system may include one or more of the following features, either alone or in combination.

The dimension of the DIB may correspond to an edge of the DIB. The resources may be distributed across an entirety of the edge. The resources may be distributed symmetrically across multiple edges of the DIB. The resources may be distributed on the DIB so that the resources align, at least partly, to the sites on the DIB.

The DIB may comprise electrical contacts enabling electrical pathways between the test instruments and the sites on the DIB. The electrical pathways between a subject test instrument and multiple sites on the DIB may have equal electrical path lengths. The electrical pathways between the sites on the DIB and the subject test instrument may have equal impedances. Each electrical pathways between a site on the DIB and the subject test instrument may produce a same amount of signal degradation.

The sites on the DIB may be distributed to enable parallel testing of identical devices connected to the sites. The DIB may be, or include, a printed circuit board (PCB) comprised of a number of layers. The number of layers may be proportional to a number of the test instruments in the tester.

The example test system may include an interconnect between the DIB and the tester. The interconnect may comprise routing connections between the test instruments and the DIB. The test instruments may comprise contacts at a first pitch and the resources may be at a second pitch. The second pitch may be less than the first pitch. The routing connections may be configured to go from the contacts of the test instruments at the first pitch to the resources at the second pitch.

The interconnect may comprise circuitry to process signals conducting through the routing connections. The circuitry may be configured to process the signals by combining first signals from two more routing connections to produce a second signal for output to a single routing electrical connection. The single routing connection may go to a resource on the DIB. The second signal may have a higher bitrate, or frequency, than each of the first signals.

The resources of the test instruments may comprise electrical contacts on the DIB. Each site on the DIB may have a same configuration.

An example test system has resources that are distributed for access by a DUT. The example test system includes a DIB comprising sites to connect to devices to test, and a tester comprising slots configured to hold test instruments. Each slot corresponds to electrical contacts that are distributed across an entire edge of the DIB that interfaces to the tester. The electrical contacts are distributed so that at least some electrical pathways between a subject test instrument and identical devices in different sites are have equal electrical path lengths. The example test system also includes an interconnect between the tester and the DIB. The interconnect may be configured to translate a pitch of contacts on the test instruments to a pitch of the electrical contacts on the DIB. The example test system may include one or more of the following features, either alone or in combination.

The contacts on the test instruments may be at a first pitch and the electrical contacts distributed across the edge of the DIB may be at a second pitch. The second pitch may be less than the first pitch. The interconnect may comprise routing connections that are configured to go from the contacts of the test instruments at the first pitch to the electrical contacts at the second pitch. The interconnect may comprise circuitry to process signals conducting through the routing connections. The circuitry may be configured to process the signals by combining first signals from two more routing connections to produce a second signal to be output to a single routing electrical contact. The single routing connection may be to an electrical contact on the DIB. The second signal may have a higher bitrate, or frequency, than each of the first signals.

Any two or more of the features described in this specification, including in this summary section, can be combined to form implementations not specifically described herein.

The systems and processes described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and processes described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

To test quantities of devices, manufacturers commonly use ATE—Automatic Test Equipment (or "testers"). In response to instructions in a test program set (TPS), ATE automatically generates test input signals (or "test signals) to be applied to a device under test (DUT), such as a bare die or dice, and monitors resulting output signals. The ATE compares the output signals with expected responses to determine whether each DUT is defective. ATE typically includes a computer system to control its operation and test instruments configured to test different aspects of the DUT.

Examples of test instruments include radio frequency (RF) test instruments for performing RF tests on a DUT; high-density digital test instruments for sending digital data to, and receiving digital data from, a DUT; and alternating current (AC) test instruments for sending analog signals to, and receiving analog signals from, a DUT. Other types of test instruments may also be used in a test system.

A device interface board (DIB) is a structure that mates to the ATE. The DIB is device-specific and is typically created by a manufacturer of the DUT. The DIB mates to the ATE to create an electrical interface between DUTs and the ATE.

The ATE includes slots configured to hold test instruments. Each test instrument has resources that are distributed over a dimension of the DIB. For example, electrical signals, such as test signals, from each test instrument may be routed to the DIB via one or more transmission media. The DIB includes electrical contacts that enable each test site equal access to those signals and the electrical pathways in the ATE that transmit those signals. In some implementations, the electrical contacts are arranged along an entire dimension of the DIB—for example, across the entirety of one, two, or more edges of the DIB. By arranging the electrical contacts across a dimension of the DIB, the resources—for example, the electrical contacts and test signals—may be distributed to enable DUTs in test sites on the DIB equal access to those resources. In some examples, equal access may mean that the electrical pathways between a test instrument and multiple sites on the DIB have equal electrical path lengths. In some examples, equal access may mean that the electrical pathways between sites on the DIB and a test instrument have equal impedances. In some examples, equal access may mean that each electrical pathway between a site on the DIB and a test instrument produces a same amount of signal degradation or noise.

Figure 1:
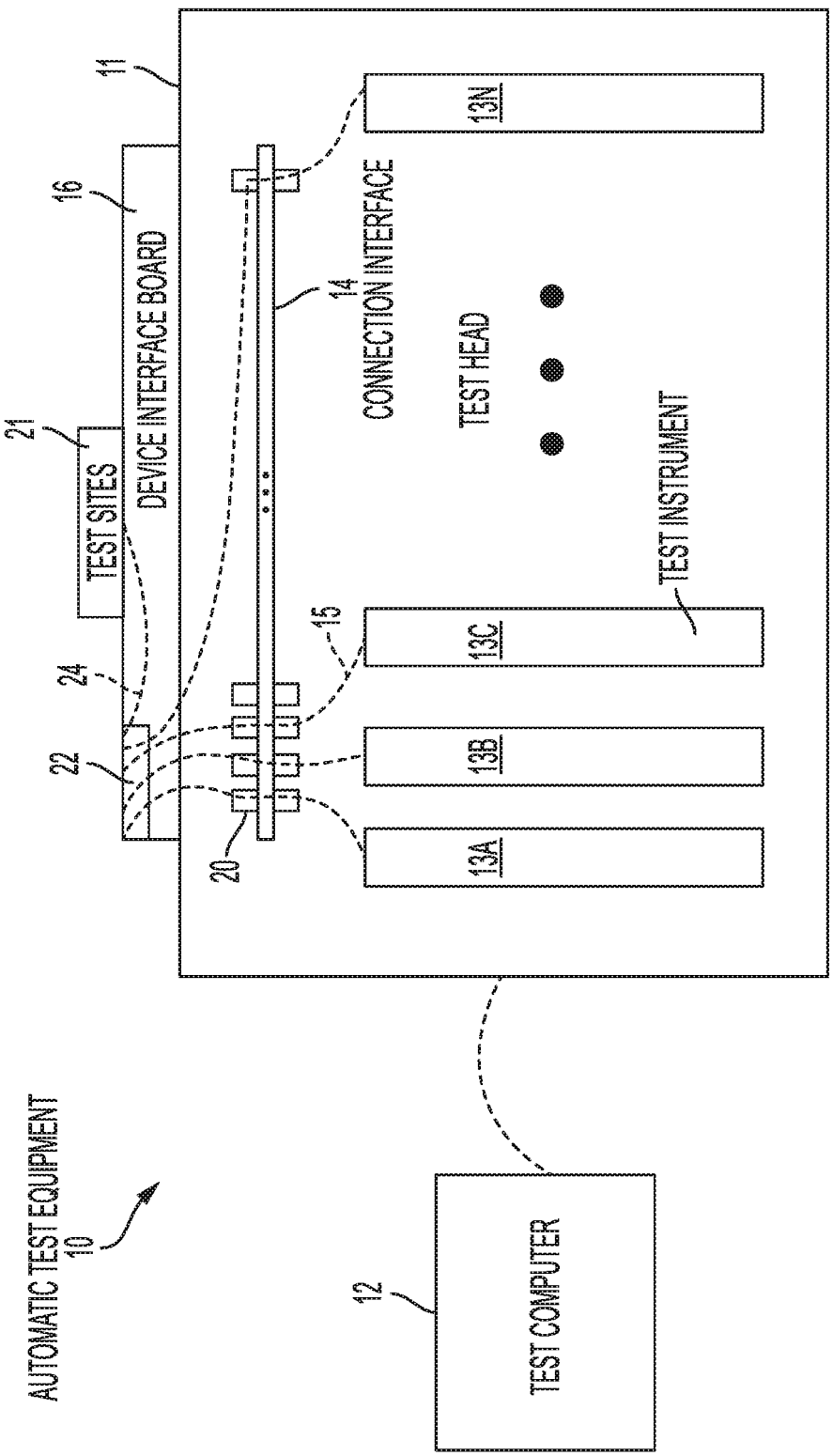
FIG. 1 is a block diagram of an example test system in side view.

FIG. 1 shows components of example ATE 10. Notably, however, the systems and processes described in this specification are not limited to use with the ATE of FIG. 1 or to use with any particular type of DUT, but rather may be used in any appropriate technical context, including outside of a testing environment. In FIG. 1, the dashed lines represent, conceptually, potential signal paths between devices.

ATE 10 includes a test head 11 and a test computer 12. Test head 11 interfaces to DUTs (not shown) on which tests are to be performed. Test computer 12 communicates with test head 11 to control testing. For example, test computer may download test program sets to test instruments on the test head, which then run the test program sets to test DUTs in communication with the test head.

ATE 10 includes test instruments 13A to 13N (N>3). In this example, the test instruments are housed in the test head. Each test instrument may be housed in a separate slot in the test head. In some implementations, the test instruments are modular. That is, one test instrument may be replaced with a different test instrument without replacing other test instruments. Each test instrument may be configured to output test signals to test a DUT, and to receive signals from the DUT. The signals may be digital, analog, wireless, or wired, for example. The signals received may include response signals that are based on the test signals and/or signals that originate from the DUT that are not prompted by (e.g., are not in response to) test signals.

ATE 10 includes a connection interface 14, which connects test instrument outputs 15 to DIB 16. Connection interface 14 may include connectors 20 or other devices for routing signals between the test instruments and DIB 16. For example, the connection interface may include one or more circuit boards or other substrates on which such connectors are mounted. Other types of connections may be used.

In the example of FIG. 1, DIB 16 connects, electrically and mechanically, to test head 11. DIB 16 includes test sites 21, which may include pins, traces, or other points of electrical and mechanical connection to which DUTs connect. Test signals, response signals, and other signals pass over the sites between the DUT and test instruments. DIB 16 also may include, for example, connectors, conductive traces, circuitry, or some combination thereof for routing signals between the test instruments and the DUTs.

In this regard, DIB 16 includes a launching area 22. Only one launching area is shown in FIG. 1. However, as explained below, a single DIB may include multiple launching areas. Signals from the test instruments are routed, via one or more transmission media, to electrical contacts in the launching area. Conductive traces 24 or other appropriate transmission media electrically connect the electrical contacts in the launching area to test sites 21 on the DIB. The test sites are distributed on the DIB to enable parallel testing of identical devices connected to the sites. By so arranging the test sites and the electrical contacts, devices in the sites have equal access to the test signals. For example, identical devices in different sites may have equal access to the same test signals from the same test instrument. By providing such equal access, it may be possible to reduce testing discrepancies caused by signal transmission. Example causes of those testing discrepancies include, but are not limited to, impedance mismatch, signal degradation, or unequal electrical path lengths.

Figure 2:
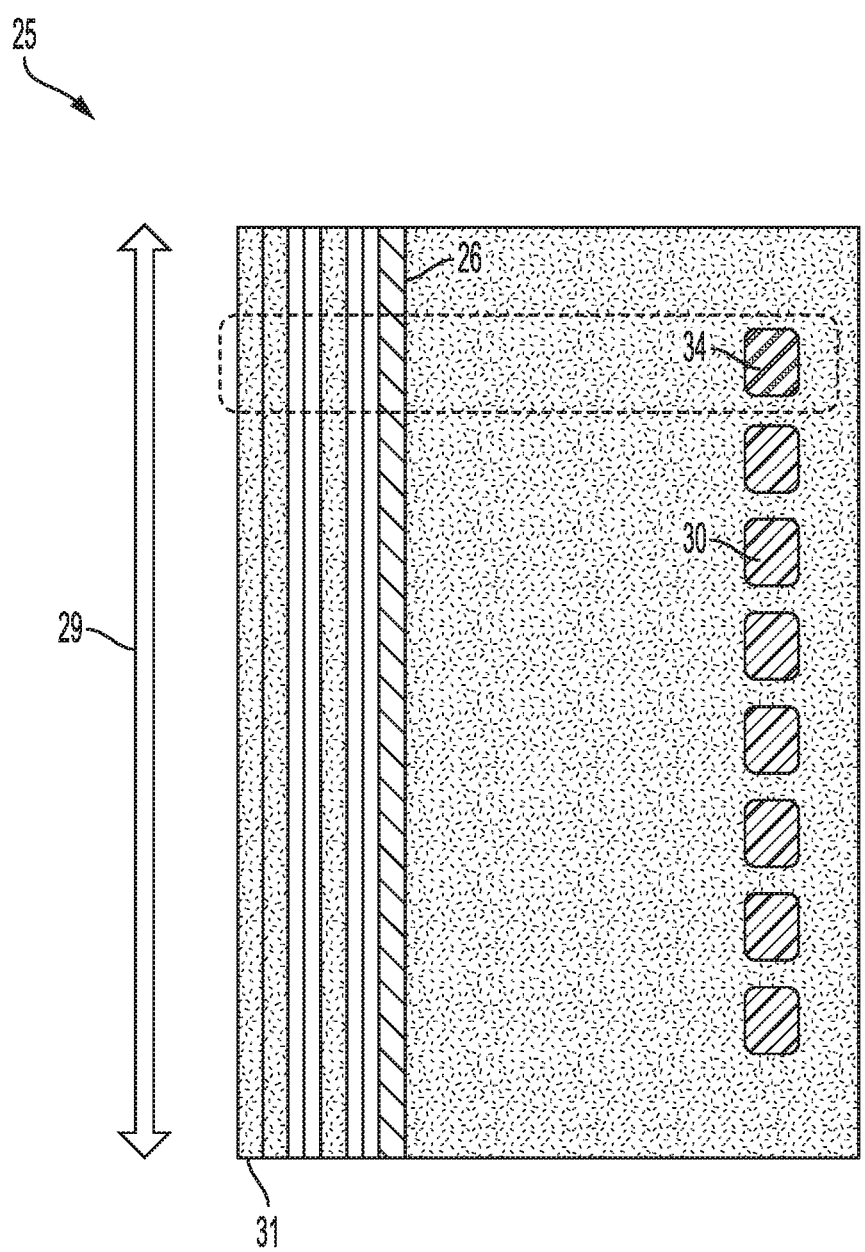
FIG. 2 is a top view of an example device interface board (DIB).

FIG. 2 is a top view of an example DIB 25. DIB 16 may be the same as DIB 25. DIB 25 includes launching area 26. Launching area 26 contains electrical contacts that connect, electrically, to one or more test instruments in slots of the test head. As shown, the electrical contacts are distributed across an entire dimension of DIB 26 so that the electrical contacts align, at least partly, to each test sites 30. In FIG. 2, the dimension along which the electrical contacts is distributed is represented by arrow 29. In some implementations, the electrical contacts align to each of the test sites in the same manner. For example, the physical distance or electrical path length between a single electrical contact and each test site may be the same. In this example, the electrical contacts are distributed across the entirety of edge 31 of the DIB. In some implementations, the electrical contacts may be distributed across less than the entirety of edge 31 of the DIB. For example, the electrical contacts may be distributed across part of an edge of the DIB. In some implementations, the electrical contacts may be distributed across all or part of a dimension of the DIB that is not along an edge of the DIB. In this example, test sites 30 are arranged in single row. In some implementations, there may be two rows of test sites or more than two rows of test sites. An example containing two rows of test sites is shown in FIG. 4.

Figure 3:
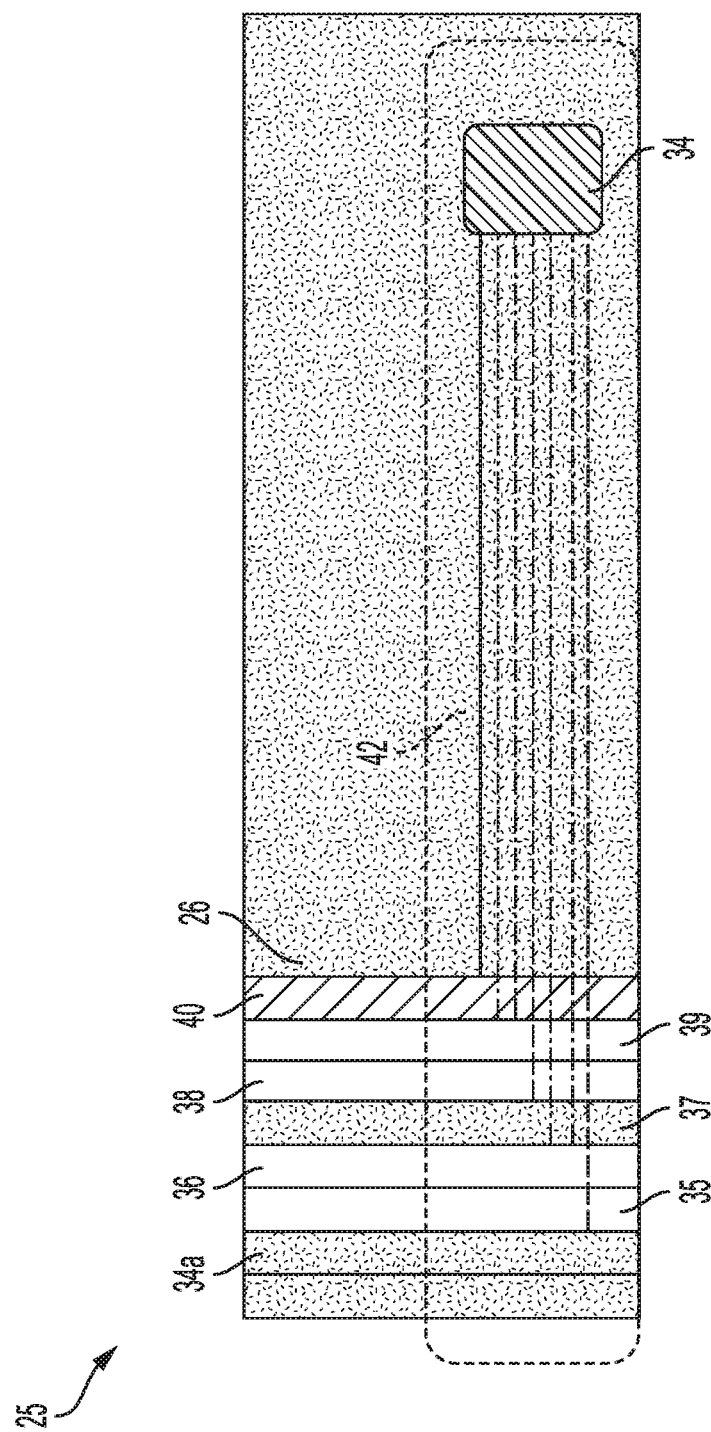
FIG. 3 is a top view of part of the example DIB of FIG. 3.

FIG. 3 shows a close-up view of test site 34 on a portion of DIB 25. As shown in FIG. 3, launching area 25 includes electrical contacts 34a to 40. In this example, electrical contact 34a is for a first test instrument, electrical contact 37 is for a second test instrument, electrical contacts 35, 36, 38, and 39 are for a third test instrument, and electrical contact 40 is for a fourth test instrument. The number and layout of contacts is an example only; any appropriate number of contacts and any appropriate layout may be used. As also shown, conductive traces 42 are routed between test site 34 and different ones of the electrical contacts. The arrangement of conductive traces shown in FIG. 3 may be repeated, identically, on the DIB for each of test sites 30. As a result of this configuration of conductive traces, and as a result of the distribution of electrical contacts across the dimension of the DIB, each DUT in a test site may have equal access to resources from all test instruments or a subset of test instruments.

Figure 4:
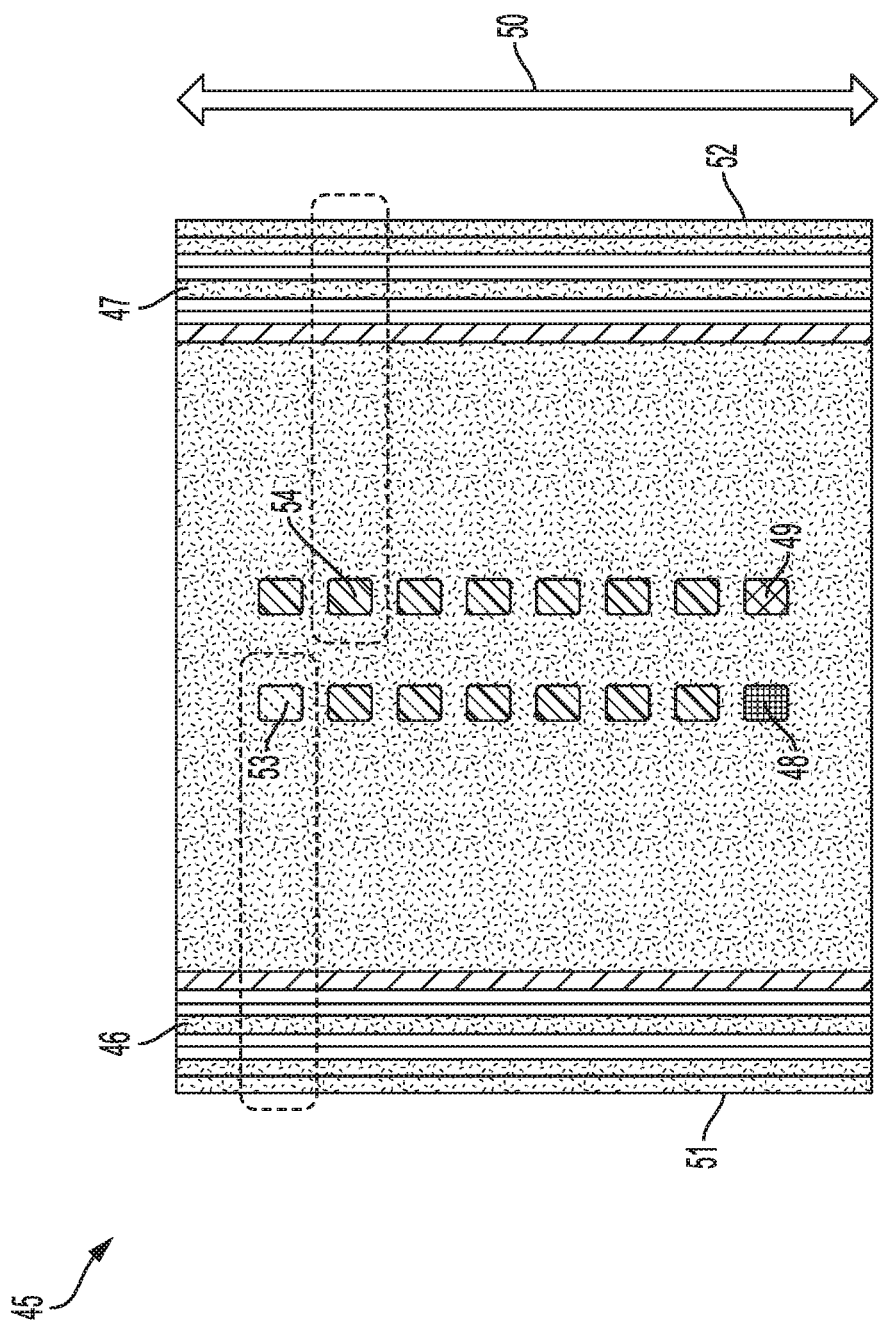
FIG. 4 is a top view of an example DIB.

FIG. 4 is a top view of another example DIB 45. DIB 16 may be the same as DIB 45. DIB 45 includes two launching areas 46 and 47. Each launching area contains respective electrical contacts 48 and 49 that connect, electrically, to one or more test instruments in slots of the test head. In this example, the electrical contacts are distributed across an entire dimension of DIB 45. In FIG. 4, the dimension along which the electrical contacts is distributed is represented by arrow 50. In this example, the electrical contacts are distributed across the entirety of two edge 51 and 52 of the DIB. In some implementations, the electrical contacts may be distributed across less than the entirety of each edge of the DIB. For example, the electrical contacts may be distributed across part of each edge of the DIB. In some implementations, the electrical contacts may be distributed across all or part of a dimension of the DIB that is not along an edge of the DIB. Test sites 53 and 54 are arranged in two parallel rows in this example. Other arrangements may also be used.

Figure 5:
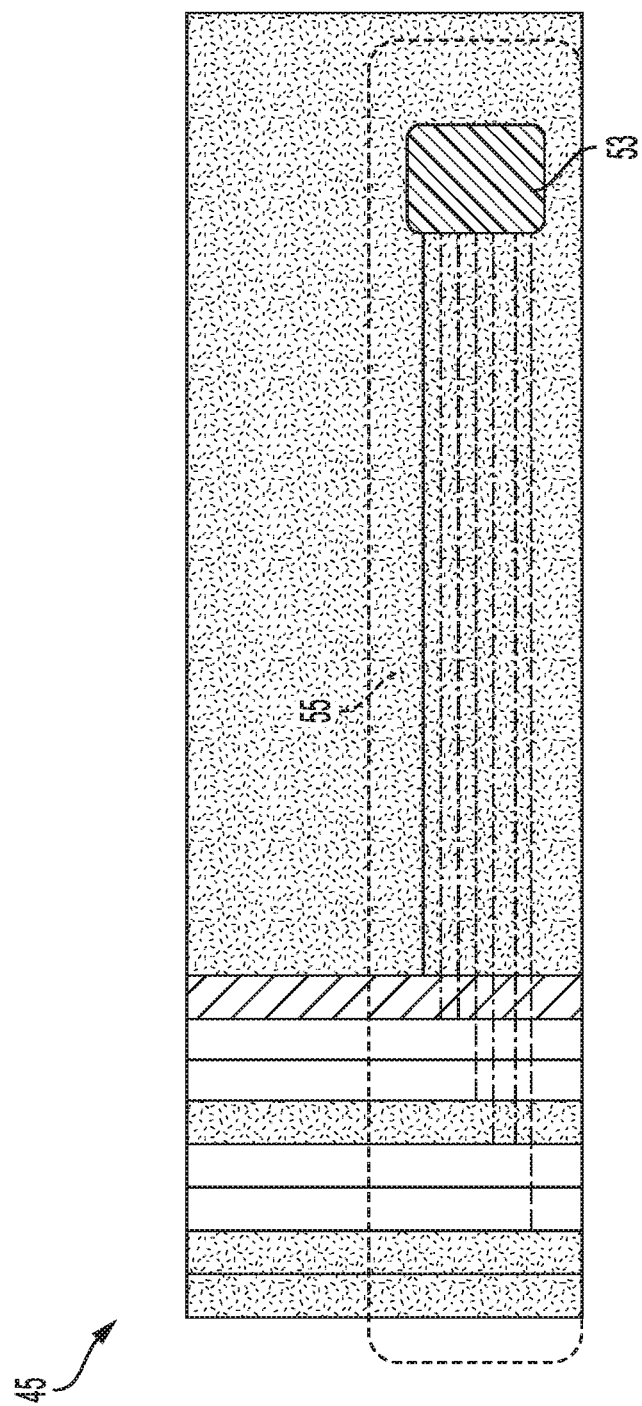
FIG. 5 is a top view of part of the example DIB of FIG. 4.

FIG. 5 shows a close-up view of part of DIB 45 containing test site 53. Test site 54 may have the same configuration and connections to contacts as test site 53. The example configuration of FIG. 5 is identical to the example configuration of FIG. 3 in this example. The arrangement of conductive traces 55 shown in FIG. 5 may be repeated, identically, on DIB 45 for each of the test sites. As a result of the identical connections between each test site and corresponding electrical contacts on the DIB, each DUT in a test site may have equal access to resources from test instruments.

As noted, in the example of FIG. 4, the configuration of electrical contacts distributed along edge 51 is identical to the configuration of electrical contacts distributed edge 52. In some implementations, the configuration of electrical contacts distributed along edge 51 may be different from the configuration of electrical contacts distributed along edge 52. That is, there may be different contact configurations across different edges or dimensions of the DIB.

Figure 6:
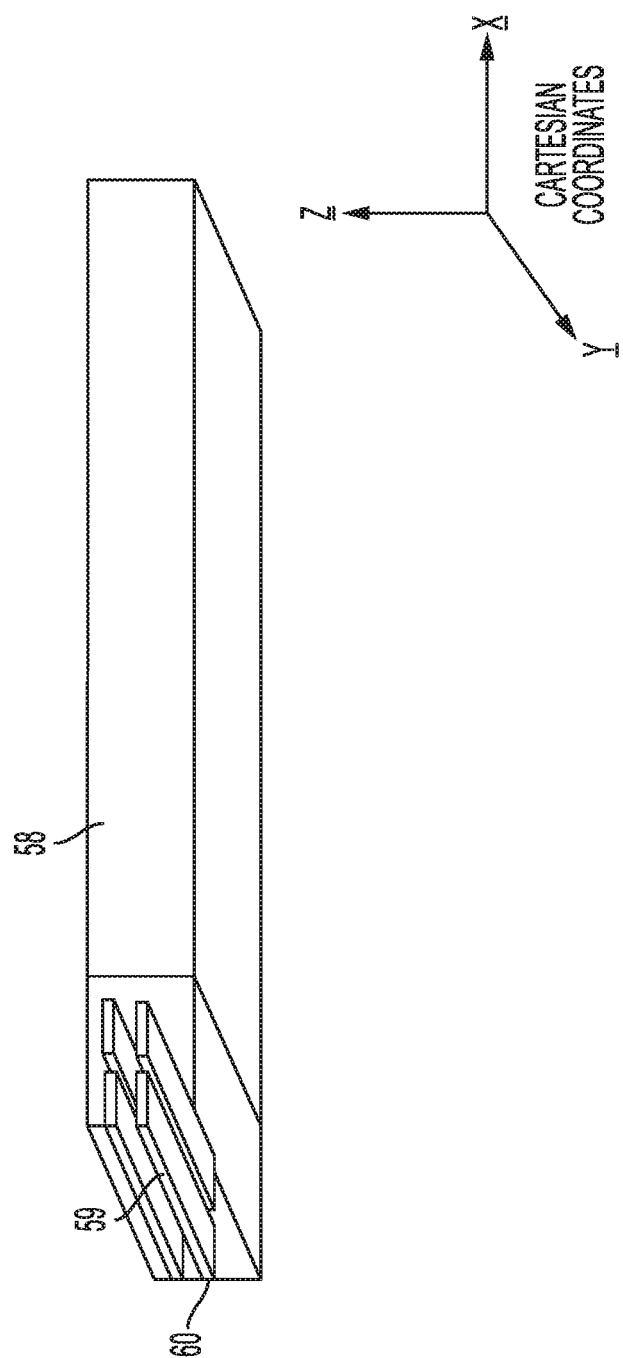
FIG. 6 is a perspective view of an example DIB showing interior components of the DIB.

In some implementations, electrical contacts from different test instruments may be located on different layers of the DIB. For example, the DIB may be, or include, a printed circuit board (PCB) comprised of multiple layers. Contacts may be distributed across the multiple layers as well as along the edge. For example, referring to FIG. 6, the edge or dimension 60 along which electrical contacts are distributed may include the Cartesian X-Y plane only or the dimension may also include a Cartesian Z-component. For example, in FIG. 6 contacts 59 may also be distributed in the Cartesian Z dimension across the edge 60 of DIB 58. In some implementations, those contacts may be distributed among different layers of the PCB in multiple planes.

In some implementations, contacts may be distributed among different layers of the DIB in order to accommodate more contacts for more test instruments. That is, by using an extra dimension for distribution, a greater number of contacts may be incorporated onto the DIB without increasing the DIB's size or without increasing the DIB's size significantly. In some implementations, the number of layers of the DIB is proportional to a number of the test instruments in the tester. For example, the more test instruments there are, the more contacts there may be. As a result, additional layers of the DIB may be included to accommodate those contacts.

Figure 7:
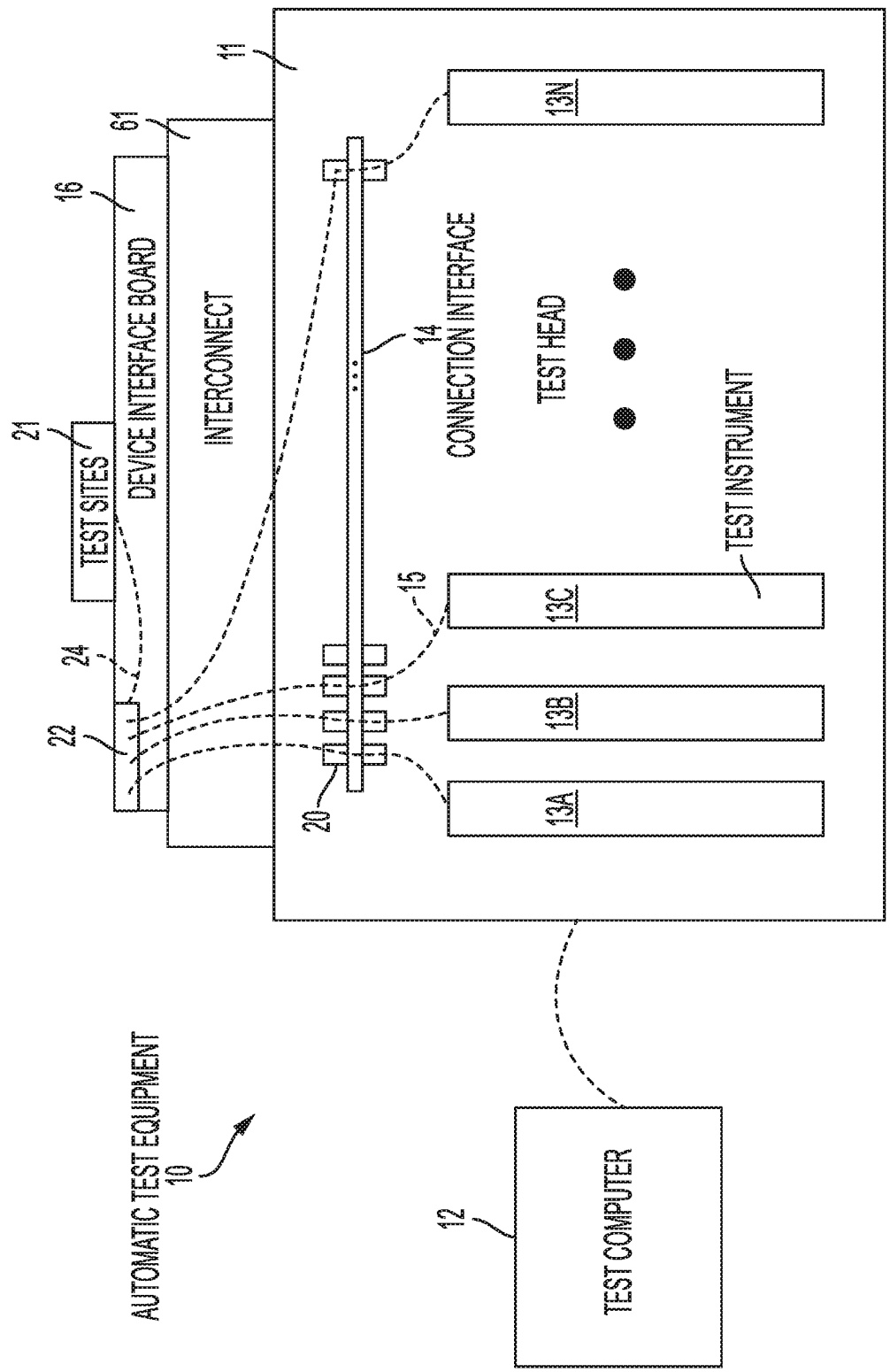
FIG. 7 is a block diagram of another example test system in side view.

Referring to FIG. 7, in some implementations, there may be an interconnect 61 between test head 11 and DIB 16. Except for interconnect 61, the structure and function of the remaining components of FIG. 7 may be identical to the structure and function of the corresponding components of FIG. 1. The interconnect includes routing connections, such as electrical conduits, to route signals through the interconnect.

In this regard, in an example test system, electrical contacts on the DIB may be arranged at a first pitch and corresponding electrical contacts on the test instruments may be arranged at a second pitch that is different from (for example, greater than) the first pitch. In this context, a pitch includes the amount by which adjacent electrical contacts are separated spatially. Interconnect 61 is configured to translate the pitch of the electrical contacts on the test instruments to the pitch of the electrical contacts on the DIB. For example, if the electrical contacts on the test instruments are separated by centimeters, the interconnect may be configured to translation that separation to millimeters on the DIB. That is, electrical contacts on the DIB may be separated by millimeters and those electrical contacts may be on electrical pathways to electrical contacts on the test instrument that are separated by centimeters. In an example, the pitch of electrical contacts on the test instruments is 1.35 inches and the pitch of electrical contacts on is DIB are 0.34 inches. The interconnect bridges this difference.

Figure 8:
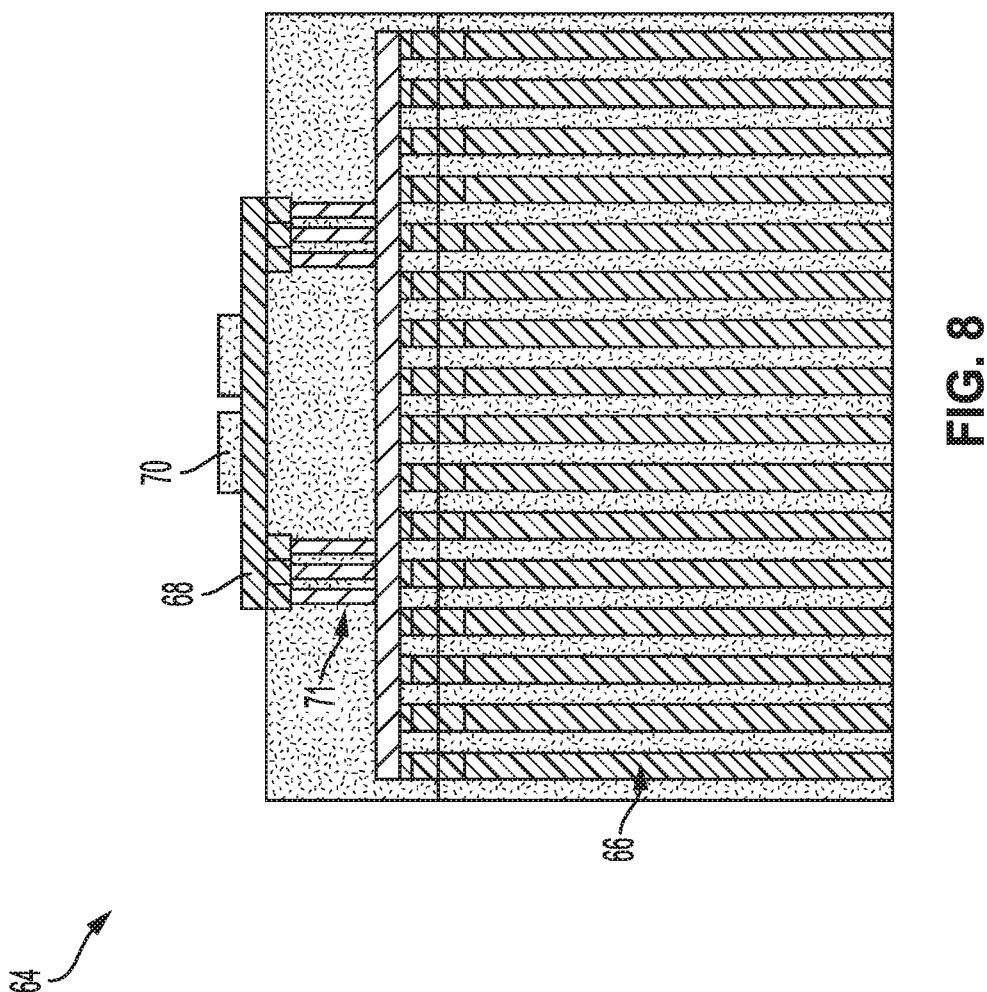
FIG. 8 is a cut-away, side view of an example interconnect.

FIG. 8 shows an example interconnect 64. Interconnect 61 may be the same as interconnect 64. Interconnect 64 routes signal between test instruments 66 and DIB 68. Electrical connections to test sites 70 on the DIB may be implemented as described previously. The test instruments may perform the actual testing on a DUT, e.g., by sending signals to the DUT through interconnect 64, through the electrical contacts on the DIB, and through conductive traces on the DIB to the test sites. Responses to those signals may retrace that path to reach the test instruments, where those responses are measured to determine whether a DUT is operating properly. In some implementations, the test instruments may perform processing outside of the test head, e.g., at one or more processing devices, such as a computing system.

In the example of FIG. 8, electrical conduits 71 originating at electrical contacts on test instruments 66 are routed, through the interconnect, to mate to the electrical contacts in the launching area of the DIB. The electrical contacts on the DIB may be arranged along all or part of a dimension of the DIB, as shown in FIGS. 2 and 4.

In some implementations, the electrical conduits 71 in the interconnect include cables. The cables may include any appropriate type of electrical transmission medium. In some implementations, the cables may include optical transmission media. In an example, the cables may be part of a coaxial structure. In this regard, the cables may be coaxial cables that are incorporated in the coaxial structure. For example, the cables may be an integral part of the coaxial structure, and may be formed inside the coaxial structure. In some implementations, a coaxial line in a coaxial structure includes, but is not limited to, a signal (or force) line surrounded completely by a dielectric, such as air, that is, in turn, surrounded completely by return (or ground) line. "Coaxial", as used herein, does not require that the same dielectric completely surround the force line, nor does it require that a return line completely surround the dielectric. This is the case for any coaxial line, cable, structure, etc. described herein.

In order to promote consistency in signal transmission, electrical characteristics of different conduits may substantially match. For example, the impedances of different conduits may be controlled to be substantially the same. In this context, impedance-control includes the ability to specify the impedance of individual conduits and to match the impedances of different conduits. Also, the electrical path length (as opposed to the physical path length) as measured by ToF (Time of Flight) of the different conduits should be substantially the same. And, the signal attenuation produced by different electrical conduits should be substantially the same. In some implementations, all electrical conduits in the interconnect have the same impedance, electrical path length, and attenuation. In other implementations, this need not be the case. For example, in some implementations, the test electronics may account for, and/or correct for, variations in one or more of these parameters.

In the example interconnect described herein, at least some of (e.g., all of) the electrical conduits are configured to have substantially matching electrical characteristics, such as electrical path lengths/Time of Flight (ToF), impedances, and signal attenuation. By substantially matching these electrical characteristics, it may be possible to reduce the chances that there will be differences in signal transmission time between conduits, and thereby reduce timing errors resulting from transmission through the interconnect. In this context, a substantial match may include a match that is identical or to within one or more predefined tolerances, such as 1%, 2%, 5%, or 10%. In some implementations, it may be appropriate to substantially match only one or two of electrical path length, impedance, and signal attenuation.

In some implementations, matching electrical characteristics are achieved, at least in part, by using, e.g., curved, zig-zagged, serpentine, or spring-shaped conduit portions. For example, individual conduits within the interconnect may include portions such as these that are not straight. These portions may be configured so that the electrical path lengths, impedances, and signal attenuation are the same among different conduits. For example, the addition of a curved, zig-zagged, serpentine, or spring-shaped conduit portion effectively elongates the signal transmission path of a conduit, thereby changing the electrical characteristics of those conduits. For example, such curved, zig-zagged, serpentine, or spring-shaped conduit portions can be used to change electrical path lengths, impedances, and signal attenuation. Such changes may be effected to match electrical characteristics (e.g., electrical path lengths, impedances, and signal attenuation) between two different conduits in the interconnect. Curved, zig-zagged, serpentine, or spring-shaped conduit portions may be added to any appropriate part or parts of a conduit to achieve desired electrical characteristics.

In some implementations, data stored in a EEPROM (electrically erasable programmable read-only memory) or other memory on a DIB may contain calibration data comprising electrical length information that may also be used by the test instruments to correct for mismatches in electrical characteristics of traces or cables.

In some implementations, additional passive and/or active electrical components may be incorporated into the interconnect to change electrical characteristics such as electrical path lengths, impedances, and signal attenuation in order to match those characteristics among two or more electrical conduits. In some implementations, the shapes of different conduits may vary to achieve appropriate matching. In some implementations, differently-shaped conduits in combination with active and/or passive components may be used to change electrical characteristics such as electrical path lengths, impedances, and signal attenuation, so as to match those characteristics among two or more electrical conduits.

In some implementations, the interconnect includes circuitry to process signals conducting through the electrical conduits. For example, the circuitry may be configured to process the signals by combining first signals from two more electrical conduits to produce a second signal to be output to a single electrical conduit that is on a path to an electrical contact on the DIB. The second signal may have a higher bitrate than each of the first signals. Thus, the interconnect may be used to generate higher-speed signals from slower-speed signals. In some implementations, a multiplexer may be used to combine the signals and to output a single signal. In some implementations, one or more multiplexers may be configured to combine more than two signals to produce a single output signal having an increased bitrate. In some implementations, the interconnect may include a demultiplexer to receive a single high bitrate signal and to create multiple lower bitrate signals from the single high bitrate signal.

In some implementations, one or more MEMS (Micro Electro-Mechanical Systems) devices may be included in the interconnect. The MEMS devices may include, or implement, switches or other structures that are configurable to change the routing connections within the interconnect. For example, a computing system may control configuration and reconfiguration of the MEMs devices. Thus, the interconnect is configurable to accommodate different types of DIBs. For example, the interconnect may be configurable to accommodate DIBs for different DUTs or from different device manufacturers.

In some implementations, the electrical pathway between the test instrument and contacts on the DIB includes structures in addition to an interconnect. For example, in some implementations, one or more pins (e.g., spring-based POGO® pins) may electrically and physically connect electrical conduits in the interconnect to corresponding contacts on the DIB. In some implementations, one or more MEMS devices may make the appropriate electrical and physical connection between electrical conduits in the interconnect and corresponding contacts on the DIB.

In some implementations, a secondary PCB may connect to the DIB. The secondary PCB may expand user space and may be used for additional test electronics. The interconnect may be configured to include electrical paths to the secondary PCB in a similar manner as described herein for the DIB.

In some implementations, a DUT may be, or include, a wafer comprised of multiple chips to be tested. Following testing, the chips may be cut from the wafer and tested individually. A probe card may be used as an interface between the test system and a wafer to be tested in some implementations.

The example test system described herein may be implemented by, and/or controlled using, one or more computer systems comprising hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The example test system described herein can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a wired or wireless connection that includes or does not include intervening components but that nevertheless allows electrical signals to flow between connected components. Any "connection" involving electrical circuitry that allows signals to flow, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A system comprising:
   a device interface board (DIB) comprising sites to connect to devices to test;
   a tester comprising slots configured to hold test instruments, each test instrument having resources that are distributed over a dimension of the DIB, the resources being distributed to enable the devices in the sites equal access to the resources; and
   an interconnect between the DIB and the tester, the interconnect comprising routing connections between the test instruments and the DIB;
   wherein the interconnect comprises circuitry to process signals conducting through the routing connections; and
   wherein the circuitry is configured to process the signals by combining first signals from two more routing connections to produce a second signal for output to a single routing connection, the single routing connection going to a resource on the DIB.

2. The system of claim 1, wherein the dimension corresponds to an edge of the DIB and the resources are distributed across an entirety of the edge.

3. The system of claim 1, wherein the dimension corresponds to an edge of the DIB and the resources are distributed symmetrically across multiple edges of the DIB.

4. The system of claim 1, wherein the resources are distributed on the DIB so that the resources align, at least partly, to the sites.

5. The system of claim 1, wherein the resources comprises electrical contacts enabling electrical pathways between the test instruments and the sites on the DIB.

6. The system of claim 5, wherein the electrical pathways between a subject test instrument and multiple sites on the DIB have equal electrical path lengths.

7. The system of claim 5, wherein the electrical pathways between the sites on the DIB and a subject test instrument have equal impedances.

8. The system of claim 5, wherein each electrical pathway between a site on the DIB and a subject test instrument produces a same amount of signal degradation.

9. The system of claim 1, wherein the sites are distributed to enable parallel testing of identical devices connected to the sites.

10. The system of claim 1, wherein the DIB comprises a printed circuit board (PCB) comprised of a number of layers; and
    wherein the number of layers is proportional to a number of the test instruments in the tester.

11. The system of claim 1, wherein the test instruments comprise contacts at a first pitch and the resources are at a second pitch, the second pitch being less than the first pitch; and
    wherein at least some of the routing connections are configured to go from the contacts of the test instruments at the first pitch to the resources at the second pitch.

12. The system of claim 1, wherein the second signal has a higher bitrate than each of the first signals.

13. The system of claim 1, wherein the resources comprise electrical contacts on the DIB.

14. The system of claim 1, wherein each site on the DIB has a same configuration.

15. A system comprising:
a device interface board (DIB) comprising sites to connect to devices to test;
a tester comprising slots configured to hold test instruments, each slot corresponding to electrical contacts that are distributed across an entire edge of the DIB that interfaces to the tester, the electrical contacts being distributed so that at least some electrical pathways between a subject test instrument and identical devices in different sites have equal electrical path lengths; and
an interconnect between the tester and the DIB, the interconnect being configured to translate a pitch of contacts on the test instruments to a pitch of the electrical contacts on the DIB;
wherein the contacts are at a first pitch and the electrical contacts are at a second pitch, the second pitch being less than the first pitch;
wherein the interconnect comprises routing connections that are configured to go from the contacts of the test instruments at the first pitch to the electrical contacts at the second pitch;
wherein the interconnect comprises circuitry to process signals conducting through the routing connections; and
wherein the circuitry is configured to process the signals by combining first signals from two more routing connections to produce a second signal to be output to a single routing connection, the single routing connection going to an electrical contact on the DIB.

16. The system of claim 15, wherein the second signal has a higher bitrate than each of the first signals.

17. The system of claim 15, wherein the electrical contacts are distributed symmetrically across multiple edges of the DIB.

18. The system of claim 17, wherein the electrical contacts are distributed on the DIB so that the electrical contacts align, at least partly, to the sites.

19. The system of claim 17, wherein the electrical pathways between the sites on the DIB and the subject test instrument have equal impedances.

20. The system of claim 17, wherein each electrical pathway between a site on the DIB and the subject test instrument produces a same amount of signal degradation.

21. The system of claim 15, wherein the sites are distributed to enable parallel testing of identical devices connected to the sites.

22. The system of claim 15, wherein the DIB comprises a printed circuit board (PCB) comprised of a number of layers; and
wherein the number of layers is proportional to a number of the test instruments in the tester.

* * * * *